(12) United States Patent
Park et al.

(10) Patent No.: US 8,558,388 B2
(45) Date of Patent: Oct. 15, 2013

(54) PATTERNABLE ADHESIVE COMPOSITION, SEMICONDUCTOR PACKAGE USING THE SAME, AND METHOD OF MANUFACTURING SEMICONDUCTOR PACKAGE

(75) Inventors: Joon-Yong Park, Suwon-si (KR); Yong Seok Han, Anyang-si (KR); Jae Jun Lee, Suwon-si (KR); Chul Ho Jeong, Gwangju (KR)

(73) Assignee: Samsung Electronics Co., Ltd. (KR)

( * ) Notice: Subject to any disclaimer, the term of this patent is extended or adjusted under 35 U.S.C. 154(b) by 156 days.

(21) Appl. No.: 13/291,588

(22) Filed: Nov. 8, 2011

(65) Prior Publication Data
US 2012/0181703 A1  Jul. 19, 2012

(30) Foreign Application Priority Data

Jan. 14, 2011  (KR) .................. 10-2011-0004268

(51) Int. Cl.
*H01L 23/48* (2006.01)
*H01L 23/52* (2006.01)
*H01L 29/40* (2006.01)

(52) U.S. Cl.
USPC ................ 257/774; 438/455; 257/E23.011

(58) Field of Classification Search
USPC .......... 257/774, 753, 783, E21.011, E21.211; 438/455; 522/49
See application file for complete search history.

(56) References Cited

U.S. PATENT DOCUMENTS

| | | | |
|---|---|---|---|
| 2011/0091811 A1* | 4/2011 | Song et al. ................. | 430/271.1 |
| 2012/0004341 A1* | 1/2012 | Kim et al. ................. | 522/79 |
| 2012/0181702 A1* | 7/2012 | Lee et al. ................. | 257/774 |

FOREIGN PATENT DOCUMENTS

KR    10-0621438 B1    8/2006

* cited by examiner

*Primary Examiner* — Chuong A Luu
*Assistant Examiner* — Nga Doan
(74) *Attorney, Agent, or Firm* — Cantor Colburn LLP (57) ABSTRACT

A patternable adhesive composition including at least one alkali soluble resin including an alkali soluble group and an acryloyl group, at least one radically polymerizable compound, at least one thermosettable compound, and at least one photo-radical initiator.

20 Claims, 2 Drawing Sheets

PATTERNABLE ADHESIVE COMPOSITION, SEMICONDUCTOR PACKAGE USING THE SAME, AND METHOD OF MANUFACTURING SEMICONDUCTOR PACKAGE

CROSS-REFERENCE TO RELATED APPLICATION

This application claims priority to Korean Patent Application No. 10-2011-0004268, filed on Jan. 14, 2011, and all the benefits accruing therefrom under 35 U.S.C. §119, the content of which in its entirety is herein incorporated by reference.

BACKGROUND

1. Field

This disclosure relates to a patternable adhesive composition, a semiconductor package using the same, and a method of manufacturing the semiconductor package.

2. Description of the Related Art

In recent years, various semiconductor packages for high integration and high capacity of a semiconductor device have been developed. In semiconductor packages, a patternable adhesive film is used to adhere a semiconductor die to a support substrate and/or to adhere a semiconductor die to another die. Development of a through-silicon-via ("TSV") technique, which includes forming through electrodes and then providing a 3-dimensional stack structure, has progressed. The TSV technique is regarded as a technique which can overcome the restrictions of wire-bonding, which is presently the most popular chip package technique, including restrictions such as 2-dimensional shrinkage, 3-dimensional form factor, and restricted communication speed between dies. The TSV technique using the through electrodes may involve interposing a patternable adhesive film between dies.

To use a patternable adhesive film on a semiconductor die with the TSV technique, the patternable adhesive film should not only be adhesive, but also patternable, heat resistant, dimensionally stable, moisture resistant, and provide high-temperature adhesiveness. While a number of adhesive films are known in the art, there nonetheless remains a need for improved patternable adhesives, particularly patternable adhesives that have all of the foregoing characteristics.

SUMMARY

A patternable adhesive composition with excellent heat resistance, particularly high heat resistance, and patternability, which may be patterned and which adhered at a high temperature, is disclosed.

In an aspect, a patternable adhesive composition including at least one alkali soluble resin A having an alkali soluble group and an acryloyl group; at least one radically polymerizable compound B; at least one thermosettable compound C; and at least one photo-radical initiator D is provided.

The at least one alkali soluble resin A has a weight-average molecular weight of about 5 to about 30 kiloDaltons (kDa) and a glass transition temperature of about 100° C. or higher. The at least one alkali soluble resin A has an acid value of about 30 to about 100 milligrams KOH per gram (mg KOH/g), the patternable adhesive composition has a total acid value of about 40 to about 60 mgKOH/g and a film of the patternable adhesive composition has a dissolution rate of about 0.1 micrometer per second (μm/sec) or more when contacted with a 2.38 percent by weight of a tetramethylammonium hydroxide ("TMAH") developing solution, and The film has a thickness variation of less than about 5% after an exposing process and a developing process.

In an embodiment, when an exposed portion of a film of the patternable adhesive composition is exposed for about 200 seconds at a radiation dose of about 500 to about 3000 mJ/cm$^2$ at the wavelength of 365 nanometers (nm) from a Hg i-line, a thickness variation of the exposed portion may be less than 5%.

In another aspect, a semiconductor package including a patternable adhesive film, which is prepared from the patternable adhesive composition, wherein the patternable adhesive film is interposed between semiconductor dies, is provided.

In another aspect, a method of manufacturing a semiconductor package including: forming a patternable adhesive film using the patternable adhesive composition; laminating the patternable adhesive film on a surface of a semiconductor wafer; forming a predetermined pattern from the patternable adhesive film; and forming an adhesive layer from the patterned adhesive film by a thermal curing process is provided.

In an embodiment, a method of manufacturing a semiconductor package includes: forming an patternable adhesive film with the patternable adhesive composition; laminating the patternable adhesive film on a front surface of a semiconductor wafer in which through electrodes having solder disposed on top ends thereof are disposed; exposing at least a portion of the laminated patternable adhesive film to a wavelength of light effective to crosslink the exposed portion of the film; contacting the exposed patternable adhesive film with an alkali to remove the unexposed portions of the patternable adhesive film to form a pattern corresponding to the through electrodes; lapping an opposite rear surface of the semiconductor wafer to protrude lower portions of the through electrodes, dicing the semiconductor wafer to form at least a first and a second semiconductor die having a predetermined size; stacking a front surface of at least a first semiconductor die having the patternable adhesive film on a rear surface of at least a second semiconductor die from which the through electrodes protrude; and physically fixing the at least first and second semiconductor dies by heating the stack to bond the through electrodes using the solders and to thermally cure the patterned adhesive film to manufacture the semiconductor package, for example heating the stack to about 260° C. for 10 seconds or less.

Optionally, after the stacking, the method may further include treating the stack of the first and second semiconductor dies with an epoxy molding compound ("EMC"), and then heating the epoxy moulding compound treated stack at a temperature and for a time effective to hard bake the epoxy molding compound, for example at about 175° C. for about 2 hours.

Also disclosed is a patternable adhesive film including the above-described patternable adhesive composition, wherein substantially no organic solvent is present in the film.

BRIEF DESCRIPTION OF THE DRAWINGS

The above and other aspects, advantages and features of this invention will become more apparent by describing in further detail exemplary embodiments thereof with reference to the accompanying drawings, in which.

DETAILED DESCRIPTION

The invention now will be described more fully hereinafter with reference to the accompanying drawings, in which a non-limiting embodiment is shown. This invention may, however, be embodied in many different forms, and should not be construed as limited to the example embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the invention.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated regions, integers, steps, operations, elements, and/or components, but do not preclude the presence or addition of one or more other regions, integers, steps, operations, elements, components, and/or groups thereof.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

One or more embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear portions. Moreover, sharp angles that are illustrated may be rounded. Thus, the regions illustrated in the figures are schematic in nature and their shapes are not intended to illustrate the precise shape of a region and are not intended to limit the scope of the claims.

Patternable Adhesive Composition

A patternable adhesive composition according to an exemplary embodiment comprises: an alkali soluble resin A comprising at least one alkali soluble group and an acryloyl group; at least one radically polymerizable compound B; a thermosettable compound C; and a photo-radical initiator D. As described in greater detail below, the patternable adhesive composition may be used to form a film.

A thickness variation of a film of the patternable adhesive composition after exposing the film to a radiation source to crosslink an exposed portion of the film and developing the exposed film, may be less than about 5 percent (%), or about 0.1 to about 5%, or about 0.5 to about 4%. For example, when the exposed portion is exposed for about 200 seconds at a radiation dose of about 500 to about 3000 milliJoules per square centimeter ($mJ/cm^2$) at a wavelength of 365 nanometers (nm) using an i-line of UV light source which can irradiate fine patterns, a thickness variation of the exposed portion of the film of the patternable adhesive composition may be less than 5% specifically about 0.1 to about 5%, or about 0.5 to about 4%. After the exposed portion is developed, if a thickness variation of the exposed portion is 5% or more, it means that the surface of the exposed portion is undesirably affected by a developing solution. In this case, the patternable adhesive composition may not have sufficient dimensional stability for forming a suitable patternable adhesive film, the roughness of the film of the patternable adhesive composition may also be unsuitable, and air bubbles may be generated during a final thermal adhesion process.

A non-exposed portion of the patternable adhesive composition may be dissolved at a rate of at least about 0.1 micrometer per second (μm/sec), or at least about 0.4 μm/sec, or higher, or at about 0.1 to about 100 μm/sec, or at about 1 to about 10 μm/sec, when contacted with a 2.38 percent by weight (% by weight) tetramethylammonium hydroxide ("TMAH") developing solution.

The patternable adhesive composition may form a negative pattern around a through electrode having a pitch and a diameter each independently of several tens of micrometers (μm), e.g., about 1 to about 100 μm, or about 5 to about 80 μm, or about 10 to about 60 μm, using an alkali developing solution. Thus, to form at least several hundreds of input/output ("I/O") electrodes per die in a semiconductor package, the through electrode may be miniaturized and used to form a pattern having a pitch and diameter wherein each of the pitch and the diameter may independently be several tens of μm, e.g., about 1 to about 100 μm, or about 5 to about 80 μm, or about 10 to about 60 μm.

Also, the patternable adhesive composition may be heated at a temperature of about 260° C. for about 20 seconds and cured at a temperature of about 175° C. for about 2 hours, and the patternable adhesive composition may exhibit a shear bond strength of about 3 kilograms force per 25 square millimeters (kgf/25 mm$^2$) or more, or about 3 to about 30 kgf/25 mm$^2$, or about 4 to about 20 kgf/25 mm$^2$, or about 8 kgf/25 mm$^2$ or more. Accordingly, the patternable adhesive composition may exhibit reliability within several seconds when used for bonding between semiconductor dies.

In addition, since the patternable adhesive composition has photosensitive characteristics and can be developed with an aqueous alkali solution, the patternable adhesive composition may be more environment-friendly than a developing system using other organic solvents.

In the patternable adhesive composition, a content of a solid component may be included in an amount of about 1 to about 40 parts by weight, or about 2 to about 35 parts by weight, or about 4 to about 30 parts by weight of the solid component, based on 100 parts by weight of an organic solvent. The combination of the solid component and the organic solvent may form a solution, a suspension, or a combination thereof. For example, the patternable adhesive composition may comprise about 30 to about 95 percent by weight (% by weight), or about 50 to about 80% by weight, or about 55 to about 75% by weight of the alkali soluble resin A; about 0.1 to about 20% by weight, or about 1 to about 10% by weight, or about 2 to about 8 by weight of the radically polymerizable compound B; about 0.1 to about 10% by weight, or about 1 to about 5% by weight, or about 1 to about 10% by weight of the photo-radical initiator D; and about 1 to about 60% by weight, or about 5 to about 40% by weight, or about 10 to about 30% by weight of the thermosettable compound C, each based on the total weight of the patternable adhesive composition exclusive of the solvent if present.

A suitable solvent may be selected and used as the organic solvent to uniformly dissolve or disperse the solid component, e.g., the alkali soluble resin A, the radically polymerizable compound B, the thermosettable compound C, and the photo-radical initiator D. For example, the organic solvent may be at least one selected from dimethyl formamide, dimethyl sulfoxide, toluene, benzene, xylene, methyl ethyl ketone, tetrahydrofuran, ethyl acetate, ethyl cellosolve, ethyl cellosolve acetate, dioxane, cyclohexane, and N-methyl-pyrrolidinone, and the like.

Hereinafter, respective components of the patternable adhesive composition according to an exemplary embodiment will be further disclosed.

Alkali Soluble Resin A

The alkali soluble resin A may comprise an acryloyl group having a carbon-carbon double bond (C=C) which may enable photo curing, and an alkali soluble group which may enable use of an alkali developing solution. A content of the alkali soluble resin A may be in the range of about 30 to about 95% by weight, or about 50 to about 80% by weight, or about 55 to about 75% by weight, based on the total weight of the patternable adhesive composition exclusive of the solvent if present. When the content of the alkali soluble resin A exceeds the above range, the adhesiveness may be deteriorated. When it is less than the above range, the developing rate may be reduced, thus patternability may be degraded.

When a weight-average molecular weight (MW) of the alkali soluble resin A is about 5 kiloDaltons (kDa) or less formability of the film may be impaired, and when it is about 20 kDa or more the solubility of the alkali soluble resin A in the alkali developing solution may be reduced. Also, when a glass transition temperature of the alkali soluble resin is less than about 100° C., a glass transition temperature of the patternable adhesive composition in the absence of a solvent, for example a film formed using the patternable adhesive composition may be about 30° C., and thus a gap may form during a thermal lamination and compression bonding processes. Accordingly, the alkali soluble resin A may include at least one polymer which has a weight-average molecular weight of about 5 to about 20 kDa, or about 7 to about 18 kDa, or about 9 to about 16 kDa, and a glass transition temperature of about 100° C. or more.

In an embodiment, the alkali soluble resin A may include more than one polymer having the foregoing characteristics, for example two or three polymers, each having a weight-average molecular weight of about 5 to about 20 kDa, or about 7 to about 18 kDa, or about 9 to about 16 kDa, and a glass transition temperature of about 100° C. or more. Other co-curable polymers having different weight-average molecular weights and/or glass transition temperatures may be present in the alkali soluble resin A, provided that the formability is not impaired, the solubility in the developing solution is not impaired, and the total patternable adhesive composition, in the absence of a solvent, for example a film formed using the patternable adhesive composition, has a Tg of about 50° C. or higher. For example, the alkali soluble resin A may comprise one or more other co-curable polymers having different weight-average molecular weights and/or glass transition temperatures in amounts from 0 to about 10 wt %, based on the total weight of the alkali soluble resin A.

In an embodiment the alkali soluble resin A may include at least one selected from ① an acryl polymer with a weight-average MW of about 5 to about 20 kDa, or about 7 to about 18 kDa, or about 9 to about 16 kDa and a glass transition temperature of 100° C. or higher, or about 100 to about 150° C., or about 110 to about 140° C., and which comprises a carboxyl group and an acryloyl group, ② a urethane acryl oligomer comprising a carboxyl group and an acryloyl group, and ③ a novolac acryl oligomer containing a carboxyl group and an acryloyl group. According to an exemplary embodiment, the alkali soluble resin A may contain all of the acryl polymer ①, the urethane acryl oligomer ②, and the novolac acryl oligomer ③. As used herein, "carboxyl group" encompasses groups of the formula —C(O)X wherein X is an alkali soluble group in the presence of the developing solution. The carboxyl group may accordingly be a carboxylic ester group, or a carboxylic acid.

The urethane acryl oligomer may impart flexibility to the film formed from the patternable adhesive composition, and the novolac acryl oligomer may impart rigidity to the film core. When the alkali soluble resin A contains both the urethane acryl oligomer and the novolac acryl oligomer, the alkali soluble resin A may have suitable flexibility and rigidity, and the film may have good filmability, which may substantially or effectively prevent bubbling or tenting during lamination.

The alkali soluble group may be a carboxyl group. The alkali soluble resin A may be a compound which has an acid value of about 30 to about 100, or about 40 to about 90, or about 50 to about 80 milligrams KOH per gram (mgKOH/g). When the acid value of the alkali soluble resin A is less than about 30 mgKOH/g, the solubility of a non-exposed portion in an alkali developing solution is lowered, thus patternability may be degraded. When it exceeds more than about 100 mgKOH/g, the exposed portion may collapse. When the patternable adhesive composition contains at least one alkali soluble resin A, the patternable adhesive composition may have a total acid value of about 30 to about 80, or about 40 to about 60, or about 45 to about 55 mgKOH/g.

The acryloyl-group equivalent weight of the alkali soluble resin A is not especially limited. However, it is difficult to prepare the alkali soluble resin A having an acryloyl-group equivalent weight of about 300 grams per equivalent mole (g/eq.mol) or less. Also, when the alkali soluble resin A has a high acryloyl-group equivalent weight, e.g., an acryloyl-group equivalent weight of 1000 g/eq.mol or more, photo curing may be incomplete. Accordingly, the alkali soluble resin A may have an acryloyl-group equivalent weight of about 200 to about 600 g/eq.mol, or about 300 to about 500 g/eq.mol, or about 350 to about 550 g/eq.mol.

The alkali soluble resin A is not especially limited so long as it has both an alkali soluble group and an unsaturated double bond for radical-curing. For example, the alkali soluble resin A may be a resin which has both an alkali soluble carboxylic group and a radical-curable acryloyl group. The alkali soluble group and unsaturated double bond for radical-curing may be present along the backbone of the resin, or located on a side chain, for example on a graft. For example, the alkali soluble resin A may be derived from the polymerization of a radical-curing acrylate, which may be at least one selected from methyl(meth)acrylate, ethyl(meth)acrylate, butyl(meth)acrylate, isobutyl(meth)acrylate, 2-ethylhexyl (meth)acrylate, isooctyl(meth)acrylate, glycidyl(meth)acrylate, cyclohexyl(meth)acrylate, isobornyl(meth)acrylate, benzyl(meth)acrylate, 2-hydroxy(meth)acrylate, trimethoxybutyl(meth)acrylate, ethylcarbitol(meth)acrylate, phenoxyethyl(meth)acrylate, 2-hydroxyethyl(meth)acrylate, trimethylolpropanetri(meth)acrylate, tetramethylolmethane tetra(meth)acrylate, pentaerythritolhexa(meth)acrylate, pentaerythritoltetra(meth)acrylate, dipentaerythritol monohydroxypenta(meth)acrylate, dipentaerythritol hexa(meth)acrylate, 1,4-butylene glycol di(meth)acrylate, 1,6-hexanediol di(meth)acrylate, polyethylene glycol di(meth)acrylate, oligoester(meth)acrylate, multifunctional urethane (meth)acrylate, urea acrylate, and the like, but is not limited thereto.

Radically Polymerizable Compound B.

The radically polymerizable compound B may be a multifunctional acryl monomer having at least two acryloyl groups. For example, the radically polymerizable acrylate monomer B may be at least one selected from isobornyl (meth)acrylate, 1,6-hexanediol diacrylate, triethylene glycol diacrylate, trimethylolpropane triacrylate, tetraethylene glycol diacrylate, 1,3-butanediol diacrylate, neopentyl glycol diacrylate, pentaerythritol triacrylate, dipentaerythritol hydroxypentacrylate, and the like, but is not limited thereto.

A content of the radically polymerizable compound B may be in the range of about 0.1 to about 20% by weight, or about 1 to about 10% by weight, or about 2 to about 8% by weight, based on the total weight of the patternable adhesive composition exclusive of the solvent if present. When the content of the radically polymerizable compound B exceeds the above range, the patternable adhesive composition may become too tacky to handle. When it is less than the above range, crosslinking may be insufficiently formed during a photo-curing process.

Thermosettable Compound C

The thermosettable compound may be a polymer, oligomer, or monomer-type compound as described below. Thus, the thermosettable compound C may be a commercially available multifunctional epoxy resin having at least two epoxy groups in each resin molecule. For example, the epoxy resin may be at least one selected from a bisphenol A epoxy resin, a brominated epoxy resin, a novolac epoxy resin, a phenol-novolac epoxy resin, a cresol-novolac epoxy resin, a bisphenol F epoxy resin, a hydrogenated bisphenol A resin, a glycidyl amine epoxy resin, an alicyclic epoxy resin, a trihydroxy phenylmethane epoxy resin, a bixylenol or biphenol epoxy resin, a bisphenol S epoxy resin, a bisphenol A novolac epoxy resin, a tetraphenylol ethane epoxy resin, a diglycidyl phthalate resin, a naphthalene-group-containing epoxy resin, an epoxy resin having a dicyclopentadiene backbone, and the like.

When a content of the thermosettable compound C is high, e.g., greater than about 60% by weight, based on the total weight of the patternable adhesive composition exclusive of the solvent if present, the non-exposed portion may be insufficiently developed, and patternability may be degraded. When the content of the thermosettable compound C is low, e.g., less than about 1% by weight, based on the total weight of the patternable adhesive composition exclusive of the solvent if present, the adhesiveness may be deteriorated. Accordingly, in an embodiment the thermosettable compound C may be contained in the range of about 5 to about 40% by weight, based on the total weight of the patternable adhesive composition exclusive of the solvent if present.

The thermosettable compound C may include both a solid phase thermosettable compound, which is a solid at room temperature (e.g., about 20° C.), and a liquid phase thermosettable compound, which is a liquid at room temperature (e.g., about 20° C.). The solid phase thermosettable compound may have low elution characteristics and thus may maintain adhesiveness of the exposed portion in an alkali developing solution. However, the solubility of the non-exposed portion in the alkali developing solution may be reduced, and thus patternability may be degraded. On the other hand, the liquid phase thermosettable compound may reduce a solubility resistance of the non-exposed portion in the alkali developing solution, but the liquid phase thermosettable compound may be eluted by the alkali developing solution and thus may deteriorate adhesiveness in the exposed portion. Accordingly, when a combination of the solid phase thermosettable compound and the liquid phase thermosettable compound is used, the patternable adhesive composition may exhibit improved patternability and adhesiveness.

For example, the solid phase thermosettable compound may be a multifunctional epoxy compound having a softening point of 100° C. or higher, or about 100 to about 200° C., or about 110 to about 180° C. For example, when the solid phase thermosettable compound comprises a triphenyl group, the solid phase thermosettable compound may comprise at least one selected from a phenol novolac epoxy, (including a cresol) epoxy.

The liquid phase thermosettable compound may be a multifunctional epoxy, which is a liquid at room temperature, e.g., 20° C. For example, the liquid phase thermosettable compound may be a monomer having a core, and may be a bisphenol A or a naphthalene, and at least two epoxy groups.

Although a ratio of the solid phase thermosettable compound to the liquid phase thermosettable compound is not especially limited, as the content of the liquid phase thermosettable compound is increased, the photosensitivity and the solubility in the alkali solvent of the patternable adhesive composition may increase. However, when the thermosettable compound C contains only a liquid epoxy, the adhesiveness of the liquid epoxy may be reduced due to elution of the liquid epoxy by the developing solution in the surface of the exposed portion. Also, as the content of the solid phase thermosettable compound is increased, the adhesiveness of the patternable adhesive composition may increase. However, when the total content of the thermosettable compound C is in the range of 20% or more and it contains only a solid epoxy, the developing rate may be reduced, thus patternability may be degraded. Therefore, the content of the solid phase thermosettable compound may be in the range of about 2 to about 35% by weight, or 4 to about 30% by weight, or 6 to about 25% by weight, based on the total weight of the patternable adhesive composition exclusive of the solvent if present.

Photo-Radical Initiator D

The photo-radical initiator D may be a compound which generates a radical upon ultraviolet ("UV") irradiation. For example, the photo-radical initiator D may be at least one selected from 2,2'-azobisisobutyronitrile, 2,2'-azobis(2,4-dimethylvaleronitrile)), 2,2'-azobis(4-methoxy2,4-dimethylvaleronitrile), 1,1'-azobis(cyclohexane-1-carbonitrile), dimethyl 2,2'-azobisisobutylate, 1-hydroxy-cyclohexyl-phenyl-ketone, 2-hydroxy-2-methyl-1-phenyl-1-propanone, 2-hydroxy-1-[4-(2-hydroxyethoxy)phenyl]-2-methyl-1-propanone, methyl benzoylformate, α,α-dimethoxy-α-phenylacetophenone, 2-benzyl-2-(dimethylamino)-1-[4-(4-morpholinyl)phenyl]-1-butanone, 2-methyl-1-[4-(methylthio)phenyl]-2-(4-morpholinyl)-1-propanone, diphenyl (2,4,6-trimethylbenzoyl)-phosphine oxide, phosphine oxide, and the like.

The patternable adhesive composition may contain about 1 to about 5% by weight of the photo-radical initiator D, based on the total weight of the patternable adhesive composition exclusive of the solvent if present. When a content of the patternable adhesive composition is more than 5% by weight, preparation costs may increase because the photo-radical initiator D is expensive. When it is less than 1% by weight, crosslinking during photo curing may not sufficient.

Additive E

A patternable adhesive composition according to an exemplary embodiment may further comprise at least one additive selected from a curing agent, a curing accelerator, a catalyst, a photo-acid generator, a coupling agent, and a filler. Other additives may be included, so long as they do not significantly adversely affect the desirable properties of the patternable adhesive composition.

The curing agent may be at least one selected from a phenolic compound, aliphatic amine, alicyclic amine, aromatic polyamine, polyamide, aliphatic acid anhydride, alicyclic acid anhydride, aromatic acid anhydride, dicyandiamide, a trifluoroborane complex, imidazole, tertiary amine, and the like.

The curing agent may be a phenolic compound, which may have good developability in an organic solvent and at least two phenolic hydroxyl groups in the molecule. For example, the curing agent may be at least one selected from a phenol novolac resin, a cresol novolac resin, a t-butyl phenol novolac resin, a xylene-modified novolac resin, a naphthol novolac resin, a tris(phenol) novolac resin, a tetrakis phenol novolac resin, a bisphenol A novolac resin, a poly-p-vinyl phenol resin, a phenol aralkyl resin, a tris(phenol) compound, and the like.

The curing accelerator and catalyst, if present, are not especially limited, so long as they may promote the curing of an epoxy resin. For example, the curing accelerator or catalyst may be at least one selected from an imidazole, a dicyandiamide compound, dicarboxylic acid dehydride, triphenyl phosphine, tetraphenyl phosphonium, tetraphenylborate, 2-ethyl-4-methylimidazole-tetraphenylborate, and the like.

The photo-acid generator may be a compound that can generate an acid upon UV irradiation to partially cure an epoxy resin. The photo-acid generator may be selected from an aromatic iodonium salt and an aromatic sulfonium salt. For example, the photo-acid generator may be at least one selected from di(t-butylphenyl)iodonium triflate, diphenyliodonium tetrakis(pentafluorophenyl)borate, diphenyliodonium hexafluorophosphate, diphenyliodonium hexafluoroantimonate, di(4-nonylphenyl)iodonium hexafluorophosphate, [4-(octyloxy)phenyl]phenyliodonium hexafluoroantimonate, triphenylsulfonium triflate, triphenylsulfonium hexafluorophosphate, triphenylsulfonium hexafluoroantimonate, triphenylsulfonium tetrakis(pentafluorophenyl)borate, 4,4'-bis[diphenylsulfonium]diphenyl sulfide, bis-hexafluorophosphate, 4,4'-bis[di(β-hydroxyethoxy)phenylsulfonium]diphenylsulfide bis-hexafluoroantimonate, 4,4'-bis[di(β-hydroxyethoxy)(phenylsulfonium)]diphenyl sulfide bishexafluorophosphate, 7-[di(β-toyl)sulfonium]-2-isopropylthioxanthone hexafluorophosphate, 7-[di(p-toyl) sulfonium]-2-isopropylthioxanthone hexafluoro antimonate, 7-[di(p-toyl)sulfonium]-2-isopropyl tetrakis(pentafluorophenyl)borate, phenylcarbonyl-4'-diphenylsulfonium diphenylsulfide hexafluorophosphate, phenylcarbonyl-4'-diphenylsulfonium diphenylsulfide hexafluoroantimonate, 4-tert-butylphenylcarbonyl-4'-diphenylsulfonium diphenyl sulfide hexafluorophosphate, 4-tert-butylphenylcarbonyl-4'-diphenylsulfonium diphenyl sulfide hexafluoroantimonate, 4-tert-butylphenylcarbonyl-4'-diphenylsulfonium diphenyl sulfide tetrakis(pentafluorophenyl)borate, diphenyl[4-(phenylthio)phenyl]sulfonium hexafluoroantimonate, and the like. When a content of the photo-acid generator is less than about 0.1 parts by weight, it may be difficult to obtain sufficient photocuring. When it exceeds about 10 parts by weight, photocuring may be impaired by light absorption by the photo-acid generator itself.

In an embodiment, the patternable adhesive composition may comprise a coupling agent, which may provide increased adhesive strength. For example, the coupling agent may be at least one selected from a silane coupling agent such as γ-methacryloxypropyltrimethoxysilane, vinyltriacetoxysilane, vinyltrimethoxysilane, γ-isocyanatepropyltriethoxysilane, γ-glycidoxypropyltrimethoxysilane, β-(3,4-epoxycyclohexyl)ethyltrimethoxysilane, and the like. The coupling agent may to impart high adhesive strength the photosensitive adhesive composition.

In addition, the patternable adhesive composition may comprise an organic or inorganic filler. For example, the filler may be at least one selected from an inorganic filler such as silica, alumina, boron nitride, titanium dioxide, glass, iron oxide, boron aluminum, and the like, or a ceramic filler, or a rubber filler.

Physical Properties and Applications

The patternable adhesive composition according to the above exemplary embodiments may be used to provide a film having a high shear bond strength of about 3 kgf/25 mm$^2$ or higher or about 8 kgf/25 mm$^2$ or higher during thermal curing at a temperature of about 260° C., at which a solder bonding process is enabled, and during a hard baking process, which may comprise a temperature of about 175° C. for about 2 hours. Accordingly, since the patternable adhesive composition exhibits suitable adhesiveness at a temperature of about 240 to about 260° C., which may correspond to a melting point of a solder, the patternable adhesive composition may be effectively used in a through silicon via ("TSV") method by which semiconductor dies may be connected to one another by bonding the through electrodes using the solder.

Furthermore, the non-exposed portion may be developed at an alkali developing rate of about 0.1 μm/sec. For example, the non-exposed patternable adhesive composition (in the absence of any organic solvent, for example in the form of a film), may have a dissolution rate of about 0.1 μm/sec or higher, or 0.1 to 10 μm/sec, or 0.5 to 5 μm/sec when using a 2.38% by weight TMAH developing solution. Although a developing time may be arbitrarily selected, as the developing time increases, the exposed portion is in contact with the developing solution for a longer time and may be damaged by the developing solution, thus patternability may be degraded. Also, when the developing time is short, it may be difficult to provide sufficient uniformity. Thus when the developing time is short, it is difficult to provide an acceptable deviation between a difference in developing thickness relative to a point-to-point position of a 12-inch wafer and a deviation in developing thickness caused by process variability, such as a time deviation of developing equipment, and thus the entire pattern may not have sufficient uniformity. Thus, the patternable adhesive film may have a dissolution rate of about 0.1 μm/sec or higher, or about 0.4 μm/sec or higher when using a 2.38% by weight TMAH developing solution. For example, the time taken to completely dissolve the non-exposed portion in the negative photoresist with a thickness of 20 μm may be about 200 seconds at a developing rate of about 0.1 μm/sec and about 50 seconds at a developing rate of 0.4 μm/sec.

When the non-exposed portion is dissolved at the above rate, patternability is improved, and patterns having sufficient resolution and uniformity may be formed. Accordingly, it may be possible to accommodate a reduced pitch, e.g., a pitch of 100 μm or less of through electrodes and have at least 500 through electrodes in an overhead of a given area.

Furthermore, as explained above, a variation in the thickness of the exposed portion may be less than 5% after the exposed portion is developed, for example, for about 200 seconds at a radiation dose of about 500 to 3000 mJ/cm$^2$ at the wavelength of 365 nm (Hg lamp i-line). When the thickness variation of the exposed portion is 5% or more, the exposed portion may be undesirably damaged by the developing solution, and thus the surface of the resulting film may not properly function as an adhesive surface.

Patternable Adhesive Film

According to another exemplary embodiment, a patternable adhesive film manufactured using the patternable adhesive composition is provided. For example, the patternable adhesive film may be prepared by applying the patternable adhesive composition onto a base film in an appropriate thickness, and then removing a solvent.

For example, the base film may be polyethyleneterephthalate ("PET"), but is not limited thereto. A method of applying a patternable adhesive composition may include commercially available coating processes such as a dipping process, a spin coating process, or a roll coating process, but is not limited thereto. Also, the patternable adhesive composition may be applied to have a thickness suitable for its intended use. The patternable adhesive composition may be applied in the thickness of about 0.1 to about 100 μm. The solvent may be volatilized at a temperature of, for example, about 30 to about 150° C., and for about 1 minute to about 2 hours.

The patternable adhesive film according to an embodiment may be patterned in any desired manner. In the exemplary embodiment, the patternable adhesive film is patterned such that the patternable adhesive film is interposed between stacked dies to bond through electrodes using the solder in a 3-dimensional stacked package technique. Also, after the soldering bonding process and a post baking process, the patternable adhesive film may have sufficient adhesive strength as to pass a package reliability test. That is, after being heated at a temperature of about 260° C. for about 20 seconds and cured at a temperature of about 175° C. for about 2 hours, the patternable adhesive film may have a shear bond strength of about 3 kgf/25 mm$^2$ or higher, or about 8 kgf/25 mm$^2$ or higher, thereby preventing a short between electrodes due to debonding or bulk cracks.

The patternable adhesive film as described herein may be used to not only for semiconductor packages but also in different applications, for example, as an electronic material, such as an insulating coating material, an insulating layer, a semiconductor material, or as an electrode protection layer for a thin-film transistors-liquid crystal display ("TFT-LCD"). Also, the patternable adhesive film may be used with display materials such as optical fibers or liquid-crystal alignment films, and in a transparent electrode film that contains a conductive filler or has a surface coated with the conductive filler.

Semiconductor Package

According to another embodiment, disclosed is a semiconductor package in which the patternable adhesive film, which is prepared using the patternable adhesive composition, is interposed between semiconductor dies. For example, the semiconductor package may be manufactured by applying the patternable adhesive composition onto a semiconductor wafer, or attaching the patternable adhesive film, and then bonding the semiconductor die.

Figure 3:
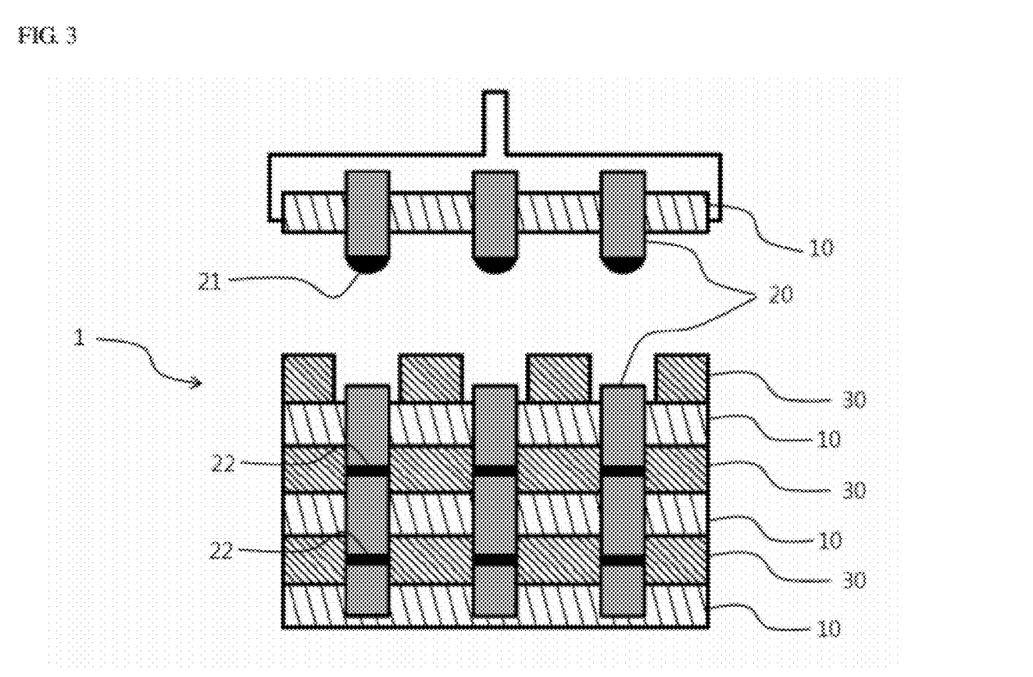
FIG. 3 is a schematic drawing of semiconductor package with a patternable adhesive film according to an exemplary embodiment.

Referring to FIG. 3, the semiconductor package 1 may be a TSV-type semiconductor package. An adhesion temperature of a stacked die package which is semiconductor wafers 10 having through electrodes 20 may be about 260° C. such that the solder bumps 21 melts to form an inter-metallic compound 22. Accordingly, since the patternable adhesive film 30 has good adhesiveness at a temperature of about 260° C., the patternable adhesive film 30 according to the exemplary embodiment may have a shear bond strength of about 3 kgf/25 mm$^2$ or higher, or about 8 kgf/25 mm$^2$ or higher, after through electrodes 20 are bonded by the solder bumps 21 at a temperature of about 260° C. and hard baked at a temperature of about 175° C. for about 2 hours.

A Method of Manufacturing a Package

According to an embodiment, a method of manufacturing a semiconductor package includes applying the patternable adhesive composition or laminating the patternable adhesive film onto a surface of a semiconductor wafer or substrate, forming a predetermined pattern using a UV exposure process and a developing process, and then adhering the predetermined pattern by a thermal curing process. A method of manufacturing a semiconductor package according to an exemplary embodiment may include: preparing an patternable adhesive film using the patternable adhesive composition; laminating the patternable adhesive film on a front surface of a wafer in which through electrodes having solder disposed on top ends thereof are disposed (e.g., formed); exposing and alkali developing the patternable adhesive film to form a pattern corresponding to the through electrodes; lapping an opposite rear surface of the semiconductor waver to protrude a lower portions of the through electrodes, dicing the wafer into dies to form at least a first and a second semiconductor having a predetermined size; stacking a front surface of the at least first semiconductor die having the patternable adhesive film on a rear surface of the second semiconductor die from which the through electrodes protrude; and physically fixing the at least first and second semiconductor dies by bonding the through electrodes using the solder at a temperature of about 260° C. and by simultaneously thermal curing the patternable adhesive film. The method may further optionally comprise bonding the through electrodes using the solder at a temperature of about 260° C., and may optionally comprise hard baking at a temperature of about 175° C. for about 2 hours.

The patternable adhesive film may be prepared in the same method as above and the patternable adhesive film may be disposed (e.g., laminated) on the entire surface of the wafer in which the through electrodes having the solder disposed on the top ends thereof are formed.

The pattern may be formed using an exposing process, such as UV irradiation using a photomask corresponding to the through electrodes to crosslink the exposed portion of the patternable adhesive film, and an alkali developing process. The exposing process may be performed at an exposure dose of about 10 to about 5000 mJ/cm$^2$, or about 500 to about 3000 mJ/cm$^2$, or about 1000 to about 2500 mJ/cm$^2$, at the wavelength of 365 nm (Hg i-line). To increase developing sensitivity, the exposing process may be followed by a post-exposure baking process which may comprise heating at a temperature of about 100° C. for several minutes.

The developing process may include removing the non-exposed portion using a developing solution. The developing process may include a puddling development method, a dipping method, a paddle method, a spray method, or a shower development method. A developing time may range from about 30 to 360 seconds, depending on the type of components of a composition, a combination ratio, and the thickness of a conductive layer. After the developing process, the exposed portion may be washed for about 20 to about 360 seconds, and hot-air dried using air arms, a hot plate, or oven, for example. The developing solution may be an alkali developing solution, such as an alkali aqueous solution. The alkali developing solution may comprise at least one compound selected from an alkali metal salt such as sodium hydroxide, potassium hydroxide, sodium carbonate, sodium silicate, or sodium metasilicate; ammonia; an alkyl amine such as ethyl amine, n-propyl amine, diethyl amine, di-n-propyl amine, triethyl amine, or methyl diethyl amine; an alkanol amine such as dimethyl ethanol amine or triethanol amine; a heterocyclic amine such as pyrrole or piperidine; a tetraalkylammonium hydroxide such as tetramethylammonium hydroxide or tetraethylammonium hydroxide; and an alkali compound such as a choline, 1,8-diazabicyclo[5.4.0]-7-undecene, and 1,5-diazabicyclo[4.3.0]-5-nonen. Also, as the developing solution, an aqueous solution obtained by adding an appropriate amount of a water-soluble organic solvent, such as methanol or ethanol, and/or a surfactant to the alkali aqueous solution may be used.

The through electrodes may be miniaturized such that about at least 500 through electrodes per die are provided. Thus, the pattern may be formed to correspond to a pitch and open dimension of several tens of μm, e.g., 20 to 100 μm. Accordingly, the pattern may be an alkali-developable negative pattern, which has a diameter of about 100 μm or less, about 70 μm or less, or about 50 μm or less, an aperture ratio of about 5% or less, or at least 500 to 1000 through electrodes per die.

Next, the through electrodes having the solder disposed on the top ends thereof may be exposed by lapping the rear surface of the wafer, and the wafer may be diced into a die having a selected size.

The front surface of the first semiconductor die having the patternable adhesive film and the rear surface of the second semiconductor die from which the through electrodes protrude may be stacked on each other. Thereafter, the first and second semiconductor dies may be physically fixed by bonding the through electrodes using the solder and by simultaneously thermally curing the patternable adhesive film. Since the electrodes may be bonded using the solder, the electrodes may be bonded under a low bonding pressure of about 1 kilograms force (kgf) or less, or about 0.01 to about 1 kgf, or 0.1 to 0.5 kgf. Thus, even when the through electrodes are bonded under a high pressure, it is less likely to break the first and second semiconductor dies. Thus, the through electrodes may be bonded using the solder at a temperature of about 260° C. for about 20 seconds or less under a pressure of about 0.1 to about 10 kgf.

Optionally, after at least two semiconductor dies are stacked on each other, the method of manufacturing the semiconductor die may further include treating a stack structure of the at least two semiconductor dies using an epoxy molding compound ("EMC") and performing a hard baking process at a temperature of about 150 to about 190° C. for about 1 to about 3 hours.

As further disclosed above, when a patternable adhesive composition as described herein is applied to a semiconductor stack package, a die-bonding technique for stacking at least two layers, for example, four layers, eight layers, or sixteen layers, may be employed. Accordingly, a parasitic capacitance, which may be generated by a stack package when using a conventional wire bonding process, is minimized or eliminated, and lower-power semiconductor chips may be manufactured. Also, as communication speed increases, the effects of the low-power semiconductor chips may also increase. In particular, integration limitations caused by the shrinkage of line widths in memory fields may be overcome by providing a 3-dimensional stack structure using the die-bonding technique with the patternable adhesive composition.

Furthermore, the above die-bonding technique may be applied to homogeneous dies of memory devices and also to heterogeneous dies of non-memory devices.

Hereinafter, the exemplary embodiments will be disclosed in further detail with reference to embodiments, Examples, Comparative Examples, and Experimental Examples. The following examples are merely to explain the exemplary embodiments, and shall not limit the exemplary embodiments.

Examples 1 to 4

A composition for forming a patternable adhesive film is prepared with materials and compositions as shown in Table 1, using an alkali soluble resin containing ACA-251AA (Daicel Chemical), CCR-1291H (Nippon Kayaku) as an acryl oligomer, and UXE-3024 (Nippon Kayaku), a radically polymerizable compound containing trimethylolpropane triacrylate ("TMPTA") (Sartomer) as an acryl monomer, a thermosettable compound containing EPPN-501H (Nippon Kayaku) as a solid epoxy, and bisphenol A diglycidyl ether (BPA-DG) (SigmaAldrich) as a liquid epoxy, a curing agent containing MEH-7800 (Meiwa), a photo-initiator containing Irgacure 369 (Ciba Specialty Chemicals) and Irgacure 819 (Ciba Specialty Chemicals), and a photo-acid generator containing triarylsulfonium hexafluoroantimonate salts (SigmaAldrich).

The materials with the compositions shown in Table 1 are mixed and dissolved in a propyleneglycol methyletheracetate ("PGMEA") solution to a total solid content of 40% by weight. The resulting patternable adhesive composition is applied on a PET film whose surface is treated with a silicone release agent, and dried in a forced convection oven at a temperature of about 85° C. for about 20 minutes to prepare a 20 μm-thick patternable adhesive film for forming a pattern.

TABLE 1

|  |  | Example 1 | Example 2 | Example 3 | Example 4 |
|---|---|---|---|---|---|
| Alkali soluble resin | ACA-251AA (Daicel Chemical) | 25 | 25 | 25 | 20 |

TABLE 1-continued

|  |  | Example 1 | Example 2 | Example 3 | Example 4 |
|---|---|---|---|---|---|
|  | CCR-1291H (Nippon Kayaku) | 30 | 30 | 30 | 30 |
|  | UXE-3024 (Nippon Kayaku) | 5 | 5 | 5 | 5 |
| Radically polymerizable compound | TMPTA* (Sartomer) | 5 | 5 | 5 | 5 |
| Thermosettable compound | Solid epoxy EPPN-501H (Nippon Kayaku) | 20 | 20 | 25 | 25 |

TABLE 1-continued

|  |  | Example 1 | Example 2 | Example 3 | Example 4 |
|---|---|---|---|---|---|
|  | Liquid epoxy BPA-DG** (SigmaAldrich) | 5 | 10 | 5 | 5 |
| Curing agent | MEH-7800 (Meiwa) | 10 | 5 | 5 | 10 |
| Photo-initiator | Irgacure 369, (Ciba) | 1.5 | 1.5 | 1.5 | 1.5 |
|  | Irgacure 819 (Ciba) | 1.5 | 1.5 | 1.5 | 1.5 |
| Photo-acid generator | TASHFP*** (SigmaAldrich) | 1.5 | 1.5 | 1.5 | 1.5 |

*TMPTA: Trimethylolpropane triacrylate
**BPA-DG: Bisphenol A diglycidyl ether
***TASHFP: Triacrylsulfonium hexafluorophosphate salts Comparative Example 1

A composition for a film is prepared in the same method as in Example 1, except that SS-3808 having a glass transition temperature (Tg) of about 70° C., a molecular weight of about 15 kiloDaltons (kDa), and an acid value of about 100 milligrams KOH per gram (mg KOH/g) is used as an alkali soluble polymer instead of ACA-251AA.

Comparative Example 2

A composition for a film is prepared in the same method as in Example 1, except that SS-3815 having a glass transition temperature (Tg) of about 130° C., a molecular weight of about 30000 Da, and an acid value of about 89 mgKOH/g is used as an alkali soluble polymer instead of ACA-251AA.

Comparative Examples 3 through 7

A composition for a film is prepared in the same method as in Example 1, except that the same compositions as in Table 2 are used.

TABLE 2

|  |  | Comparative Example 3 | Comparative Example 4 | Comparative Example 5 | Comparative Example 6 | Comparative Example 7 |
|---|---|---|---|---|---|---|
| Alkali soluble resin | ACA-251AA (Daicel Chemical) | 25 | 25 | 25 | 25 | 25 |
|  | CCR-1291H (Nippon Kayaku) | 0 | 35 | 30 | 30 | 30 |
|  | UXE-3024 (Nippon Kayaku) | 35 | 0 | 5 | 5 | 5 |
| Radically polymerizable compound | TMPTA* (Sartomer) | 5 | 5 | 5 | 5 | 5 |
| Thermosettable compound | Solid epoxy EPPN-501H (Nippon Kayaku) | 20 | 20 | 0 | 25 | 5 |
|  | Liquid epoxy BPA-DG** (SigmaAldrich) | 5 | 5 | 0 | 0 | 20 |
| Curing agent | MEH-7800 (Meiwa) | 10 | 10 | 0 | 10 | 10 |
| Photo-initiator | Irgacure 369, (Ciba) | 1.5 | 1.5 | 1.5 | 1.5 | 1.5 |
|  | Irgacure 819 (Ciba) | 1.5 | 1.5 | 1.5 | 1.5 | 1.5 |
| Photo-acid generator | TASHFP*** (SigmaAldrich) | 1.5 | 1.5 | 1.5 | 1.5 | 1.5 |

Figure 1:
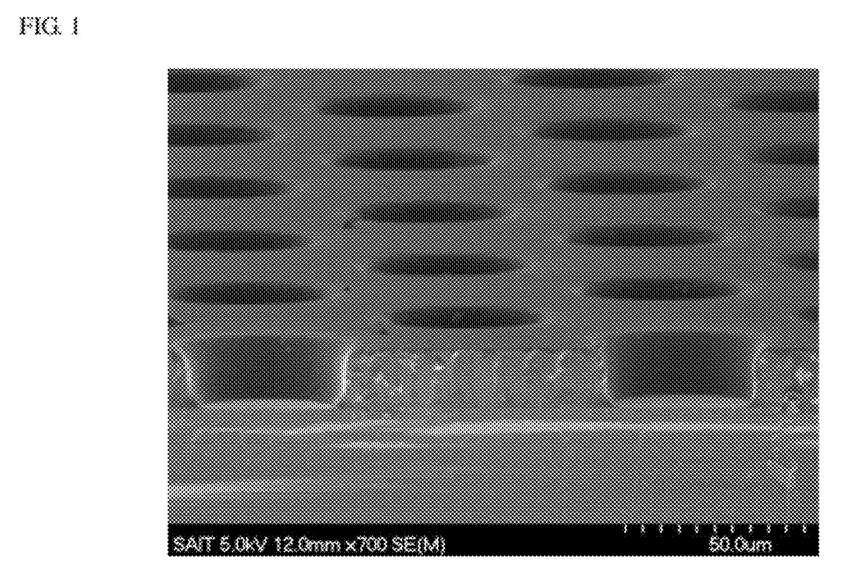
FIG. 1 is a graph showing a scanning electronic micrograph ("SEM") of a pattern according to Example 1.
Figure 2:
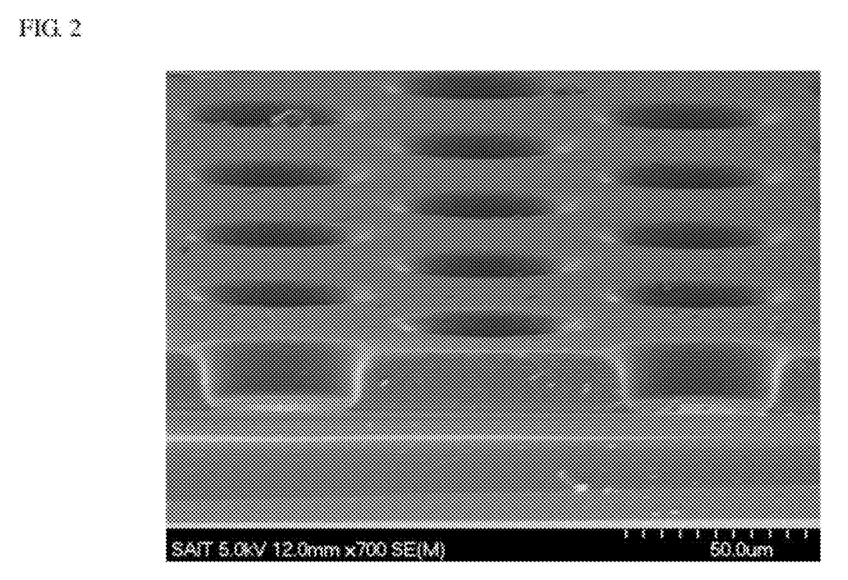
FIG. 2 is a graph showing a SEM of a pattern according to Example 2.

*TMPTA: Trimethylolpropane triacrylate
**BPA-DG: Bisphenol A diglycidyl ether
***TASHFP: Triacrylsulfonium hexafluorophosphate salts Experimental Example To confirm the physical properties of the patternable adhesive films according to the Examples, filmability, a developing rate of a non-exposed portion, patternability, and adhesiveness are evaluated by the following methods. The results are shown in Tables 3 and 4. Also, SEM of the obtained patterns are shown in FIGS. 1 and 2.

1. Filmability

The patternable adhesive film on the PET film is folded using a bar with a radius of 2 millimeters (mm), and the filmability of the patternable adhesive film is determined by observing whether cracks occurred on the patternable adhesive film. When no cracks are observed, the result is designated as A. When some cracks are occurred but a film shape is maintained, the result is designated as B. When the patternable adhesive film is broken, the result is designated as C.

2. Developing Rate of Non-Exposed Portion

A prepared patternable adhesive film is laminated on a silicon wafer by a thermal compression technique using a roll laminator at a temperature of about 75° C. A pre-baking process is performed at a temperature of about 90° C. for about 2 minutes, a post-exposure baking process is performed on a hot plate at a temperature of about 100° C. for about 5 minutes, and then an initial thickness of the patternable adhesive film stack is measured.

The patternable adhesive film stack is puddled for a predetermined amount of time with a 2.38% by weight (0.261 normal) TMAH solution as an alkali developing solution using a spin developer. The alkali developing solution is removed at a rate of about 1000 revolutions per minute (rpm) and washed by puddling with deionized water ("DIW") twice for about 30 seconds. The resulting patternable adhesive film stack is dried at a rate of about 3500 rpm for about 100 seconds, and the remaining thickness of the resulting patternable adhesive film stack is measured. A difference between the initial thickness and the remaining thickness is divided by the puddling time to obtain a developing rate.

When a developing rate is 0.4 µm/sec or higher, the result is designated as A. When a developing rate is 0.1 µm/sec or higher, the result is designated as B. When a developing rate is 0.1 µm/sec or lower, the result is designated as C.

3. Patternability

A prepared patternable adhesive film is laminated on a silicon wafer using a thermal compression technique using a roll laminator at a temperature of 75° C. The patternable adhesive film stack is prebaked at a temperature of about 90° C. for about 2 minutes, and contacted by a photomask which is plated with chromium (Cr) in a circle with a pitch of 80 µm and a critical dimension of 40 µm, and then irradiated with light at an exposure dose of 1000 mJ/cm$^2$ at the wavelength of 365 nm (Hg i-line) using a high-precision parallel exposure system (Ushio, PM25C-200). A post-exposure baking process is performed at a temperature of about 100° C. for about 5 minutes. Afterwards, the resulting stack is puddled for about 60 seconds with respect to a 2.38% by weight TMAH solution (NMD-W available from ENF Technology) as an alkali developing solution using a spin developer. The alkali developing solution is removed at a rate of about 1000 rpm, and the resulting patternable adhesive film stack is washed by puddling with deionized water ("DIW") twice for about 30 seconds. The resulting patternable adhesive film stack is dried at a rate of about 3500 rpm for about 1000 seconds and the profile of the resulting pattern is obtained using an interferometric profiler (available from Zygo).

When a pattern was precisely formed, the result is designated as A. When the remaining layer is less than about 20%, the result is designated as B. When the remaining layer is less than about 50%, the result is designated as C. When only a pattern shape is existed, result is designated as D.

4. Adhesive Strength

The prepared patternable adhesive film is laminated onto a 5 mm×5 mm silicon wafer using a thermal compression technique by a roll laminator. The laminated structure is pre-baked at a temperature of about 90° C. for about 2 minutes, the entire surface of the bonded structure is irradiated with light at a radiation dose of about 1000 mJ/cm$^2$ at the wavelength of 365 nm (Hg i-line) using a high-precision parallel exposure unit (Ushio, PM25C-200), and a post-exposure baking process is performed at a temperature of about 100° C. for about 5 minutes. The resulting structure is puddled for about 60 seconds with respect to a 2.38% by weight TMAH solution (NMD-W available from ENF Technology) as an alkali developing solution using a spin developer. The alkali developing solution is removed at a rate of about 1000 rpm, and the resulting structure is washed by puddling with DIW twice for about 30 seconds. A 10 mm×10 mm silicon die is disposed on a bottom surface of the silicon wafer, and bonded with a top surface of a 5 mm×5 mm silicon die covered with the patternable adhesive film at a temperature of 260° C. under a bonding pressure of about 1 kilograms force (kgf) for about 10 seconds. A sample, in which the patternable adhesive film is sandwiched between the semiconductor dies, is hard-baked at a temperature of about 175° C. for about 2 hours.

The maximum shear bond strengths of at least ten samples are measured using a shear bond strength measuring system at a temperature of about 260° C. at a shear rate of about 100 µm/sec. The average values of the maximum shear bond strengths are calculated and listed in Table 3. In Table 3, sec refers to seconds.

TABLE 3

| | Unit/Condition | Example 1 | Example 2 | Example 3 | Example 4 |
|---|---|---|---|---|---|
| Filmability | Room temperature, 2 mm folding crack | A | A | A | A |
| Developing rate of non-exposed portion | 2.38% by weight TMAH, room temperature | A | A | A | A |
| Patternability | 80 µm pitch, 40 µm diameter Developing solution 60 sec puddle DIW 60 sec rinse | A | A | A | A |
| Shear bond strength | 5 × 5 mm$^2$ @ 260° C., 100 µm/sec | A | A | A | A |

TABLE 4

| | Unit/Condition | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|
| Filmability | Room temperature, 2 mm folding crack | A | A | A | B | A | B | A |
| Developing rate of non-exposure portion | 2.38% by weight TAMH, room temperature | B | B | A | A | A | C | A |
| Patternability | 80 µm pitch, 40 µm diameter Developing solution 60 sec puddle DIW 60 sec rinse | D | B | C | B | A | C | D |
| Shear bond strength | 5 × 5 mm$^2$ @ 260° C., 100 µm/sec | C. | C | C | B | C | C | C |

The disclosed embodiments shall not be construed as being limited to the embodiments set forth herein. Rather, these embodiments are provided so that this disclosure will be thorough and complete and will fully convey the concept of the present invention to those of ordinary skill in the art.

While the invention has been particularly shown and described with reference to embodiments thereof, it will be understood by those of ordinary skill in the art that various changes in form and details may be made therein without departing from the spirit or scope of the present invention as defined by the following claims.

What is claimed is:

1. A patternable adhesive composition comprising:
   at least one alkali soluble resin comprising an alkali soluble group and an acryloyl group;
   at least one radically polymerizable compound;
   at least one thermosettable compound; and
   at least one photo-radical initiator,
   wherein
   the at least one alkali soluble resin has a weight-average molecular weight of about 5 to about 30 kiloDaltons and a glass transition temperature of about 100° C. or higher,
   the at least one alkali soluble resin has an acid value of about 30 to about 100 milligrams KOH per gram,
   the patternable adhesive composition has a total acid value of about 40 to about 60 milligrams KOH per gram, and
   a film of the patternable adhesive composition has a dissolution rate of about 0.1 micrometer per second or more when contacted with a 2.38 percent by weight tetramethylammonium hydroxide developing solution, and
   a film of the patternable adhesive composition having at least a portion exposed to radiation has a thickness variation of the exposed portion of less than about 5% after an exposing to irradiation process and a developing process.

2. The composition of claim 1, which comprises
   about 50 to about 80 percent by weight of the alkali soluble resin;
   about 1 to about 10 percent by weight of the radically polymerizable compound;
   about 5 to about 40 percent by weight of the thermosettable compound; and
   about 1 to about 5 percent by weight of the photo-radical initiator,
   each based on a total weight of the composition exclusive of a solvent if present.

3. The composition of claim 1, wherein the at least one alkali soluble resin has a weight-average molecular weight of about 5 to about 20 kiloDaltons and a glass transition temperature of about 100° C. or higher, and
   the at least one alkali soluble resin comprises at least one selected from an acryl polymer comprising a carboxyl group and an acryloyl group,
   an urethane acryl oligomer comprising a carboxyl group and an acryloyl group, and
   a novolac acryl oligomer comprising a carboxyl group and an acryloyl group.

4. The composition of claim 1, wherein the acryloyl group equivalent weight of the alkali soluble resin is about 300 to about 500 grams per equivalent mole.

5. The composition of claim 1, wherein the radically polymerizable compound is a multifunctional acryl monomer having at least two acryloyl groups.

6. The composition of claim 1, wherein the at least one thermosettable compound is a solid phase thermosettable compound which is a solid room temperature, and a liquid phase thermosettable compound which is a liquid at room temperature.

7. The composition of claim 6, wherein the solid phase thermosettable compound is a multifunctional epoxy compound having a softening point of about 100° C. or higher, and a content of the solid phase thermosettable compound is in the range of about 2 to about 35 percent by weight, based on a total weight of the patternable adhesive composition exclusive of a solvent if present.

8. The composition of claim 1, further comprising at least one additive selected from a curing agent, a curing accelerator, a catalyst, a photo-acid generator, a coupling agent, and a filler.

9. The composition of claim 1, which has a shear bond strength of about 3 or more kilograms force per 25 square millimeters when heated at a temperature of about 260° C. for about 20 seconds and cured at a temperature of about 175° C. for about 2 hours.

10. The composition of claim 1, wherein, when a film of the patternable adhesive composition is exposed for about 200 seconds at a radiation dose of about 500 to about 3000 milli-Joules per square centimeter at a wavelength of about 365 nanometers using an i-line of a Hg lamp and developed, a thickness variation of the exposed portion of the developed film is less than 5 percent.

11. A semiconductor package comprising
    a patternable adhesive film which is a product of the patternable adhesive composition according to claim 1, wherein the patternable adhesive film is interposed between semiconductor dies.

12. The semiconductor package of claim 11, which is a through-silicon-via semiconductor package, and has a shear bond strength of about 3 kilograms force per 25 square millimeters or more when through electrodes of a first semiconductor die are soldered to a second semiconductor die at a temperature of about 260° C. and cured at a temperature of about 175° C. for about 2 hours.

13. The semiconductor package of claim 12, wherein the shear bond strength is about 8 kilograms force per 25 square millimeters or more.

14. The semiconductor package of claim 11, wherein a non-exposed portion is developed at a developing rate of about 0.1 micrometers per second or more, and an exposed portion has a thickness variation of less than about 5 percent after a developing process.

15. A method of manufacturing a semiconductor package, the method comprising:
    forming an patternable adhesive film with the patternable adhesive composition according to claim 1;
    laminating the patternable adhesive film on a front surface of a semiconductor wafer in which through electrodes having solder disposed on top ends thereof are disposed;
    exposing at least a portion of the laminated patternable adhesive film to a wavelength of light effective to crosslink the exposed portion of the film;
    contacting the exposed patternable adhesive film with an alkali to remove the unexposed portions of the patternable adhesive film to form a pattern corresponding to the through electrodes;
    lapping an opposite rear surface of the semiconductor wafer to protrude lower portions of the through electrodes;
    dicing the semiconductor wafer to form at least a first and a second semiconductor die having a predetermined size;

stacking a front surface of at least a first semiconductor die having the patternable adhesive film on a rear surface of at least a second semiconductor die from which the through electrodes protrude; and physically fixing the at least first and second semiconductor dies by heating the stack to bond the through electrodes using the solders and to thermally cure the patterned adhesive film, to manufacture the semiconductor package.

16. The method of claim 15, further comprising, after the stacking at the least first and second semiconductor dies, treating the stack of the at least first and second semiconductor dies with an epoxy molding compound, and then heating the epoxy moulding compound treated stack at a temperature and for a time effective to hard bake the epoxy molding compound.

17. The method of claim 16, wherein heating is at about 150 to about 190° C. for about 1 to about 3 hours.

18. The method of claim 15, wherein the bonding the through electrodes using the solder is performed for about 20 seconds or less under a pressure of about 0.1 to about 10 kilograms force.

19. The method of claim 15, wherein the pattern has a diameter of about 100 micrometer or less, an aperture ratio of less than about 2 percent, or about at least 500 through electrodes per die.

20. A patternable adhesive film comprising the patternable adhesive composition of claim 1, in the absence of an organic solvent.

* * * * *